(12) United States Patent
Merrill

(10) Patent No.: US 7,164,444 B1
(45) Date of Patent: Jan. 16, 2007

(54) VERTICAL COLOR FILTER DETECTOR GROUP WITH HIGHLIGHT DETECTOR

(75) Inventor: Richard B. Merrill, Woodside, CA (US)

(73) Assignee: Foveon, Inc., Santa Clara, CA (US)

( * ) Notice: Subject to any disclaimer, the term of this patent is extended or adjusted under 35 U.S.C. 154(b) by 1166 days.

(21) Appl. No.: 10/150,584

(22) Filed: May 17, 2002

(51) Int. Cl.
- H04N 3/14 (2006.01)
- H04N 5/335 (2006.01)
- H04N 9/04 (2006.01)
- H04N 9/083 (2006.01)
- H01L 27/148 (2006.01)
- H01L 31/062 (2006.01)
- H01L 31/00 (2006.01)

(52) U.S. Cl. ............ 348/308; 348/272; 257/229; 257/292; 257/440

(58) Field of Classification Search ........ 348/294, 348/299, 314, 302, 308, 266, 272; 257/229, 257/230, 294, 440, 225, 226, 227, 231, 291, 257/292; 250/208.1
See application file for complete search history.

(56) References Cited

U.S. PATENT DOCUMENTS

| | | | |
|---|---|---|---|
| 3,971,065 A | 7/1976 | Bayer .................... 358/41 |
| 4,011,016 A | 3/1977 | Layne et al. ............. 356/195 |
| 4,238,760 A | 12/1980 | Carr .................... 357/30 |
| 4,309,604 A | 1/1982 | Yoshikawa et al. ...... 250/226 |
| 4,366,377 A | 12/1982 | Notthoff et al. ......... 250/211 |
| 4,613,895 A | 9/1986 | Burkey et al. ........... 358/41 |
| 4,651,001 A | 3/1987 | Harada et al. .......... 250/330 |
| 4,677,289 A | 6/1987 | Nozaki et al. .......... 250/226 |
| 4,772,957 A | 9/1988 | Nakagawa et al. ....... 358/280 |
| 5,397,734 A | 3/1995 | Iguchi et al. ............ 437/70 |
| 5,502,299 A | 3/1996 | Standley .............. 250/208.2 |

(Continued)

FOREIGN PATENT DOCUMENTS

EP 0 605 898 A1 7/1994

(Continued)

OTHER PUBLICATIONS

Chamberlain, Savvas G., "Photosensitivity and Scanning of Silicon Image Detector Arrays", Dec. 1969, IEEE Journal of Solid-State Circuits, vol. SC-4, No. 6, pp. 333-342.

(Continued)

Primary Examiner—Vivek Srivastava
Assistant Examiner—Justin Misleh
(74) Attorney, Agent, or Firm—Thelen Reid Brown Raysman & Steiner LLP; Steven J. Robbins

(57) ABSTRACT

A vertical color filter detector group with highlight detector for generating data for a picture element. In one embodiment, the detector group includes three photodiodes each having its own spectral sensitivity and saturation exposure level and a highlight diode having a highlight saturation exposure level. The three photodiodes are located substantially each above or below the others in a semiconductor substrate with the highlight diode in close physical proximity thereto. The four diodes react to light exposure at about the same time as one another. The saturation exposure levels of the three photodiodes are about equal to each other and the highlight saturation exposure level is higher than each of the other three levels. The highlight diode may not be directly exposed to light, but it is close enough to the exposed photodiode region to collect some photoelectrons that are not collected by the three photodiodes.

59 Claims, 5 Drawing Sheets

U.S. PATENT DOCUMENTS

| | | | | |
|---|---|---|---|---|
| 5,668,596 | A | 9/1997 | Vogel | 348/222 |
| 5,739,562 | A | 4/1998 | Ackland et al. | 257/291 |
| 5,872,371 | A | 2/1999 | Guidash et al. | 257/230 |
| 5,883,421 | A | 3/1999 | Ben Chouikha et al. | 257/461 |
| 5,889,315 | A | 3/1999 | Farrenkopf et al. | 257/552 |
| 5,899,714 | A | 5/1999 | Farrenkopf et al. | 438/202 |
| 5,965,875 | A * | 10/1999 | Merrill | 250/226 |
| 5,986,297 | A * | 11/1999 | Guidash et al. | 257/223 |
| 6,078,037 | A | 6/2000 | Booth, Jr. | 250/208.1 |
| 6,157,016 | A * | 12/2000 | Clark et al. | 250/208.1 |
| 6,365,926 | B1 * | 4/2002 | Guidash | 257/292 |
| 6,452,633 | B1 * | 9/2002 | Merrill et al. | 348/302 |
| 6,486,503 | B1 * | 11/2002 | Fossum | 257/215 |
| 6,534,759 | B1 * | 3/2003 | Koscielniak et al. | 250/214.1 |
| 6,548,833 | B1 * | 4/2003 | Lin et al. | 257/89 |
| 7,002,626 | B1 * | 2/2006 | Pain et al. | 348/241 |
| 7,088,388 | B1 * | 8/2006 | MacLean et al. | 348/234 |
| 2002/0158294 | A1 * | 10/2002 | Fujiwara et al. | 257/431 |

FOREIGN PATENT DOCUMENTS

| | | |
|---|---|---|
| JP | 61187282 | 2/1985 |
| JP | 01134966 | 11/1987 |
| JP | 01134966 A * | 5/1989 |
| WO | WO 98/19455 | 10/1997 |

OTHER PUBLICATIONS

Chouikha et al., "Buried Triple p-n Junction Structure in a BiCMOS Technology for Color Detection", 1997, IEEE, IEEE BCTM 6.4, pp. 108-111.

Chouikha et al., "Color Sensitive Photodetectors in Standard CMOS and BiCMOS Technologies", Aug. 1996, SPIE, vol. 2960, pp. 108-118.

Decker, Steven John, "A Wide Synamic Range CMOS Imager with Parallel On-Chip Analog-to-Digital Conversion", Sep. 1997, Massachusetts Institute of Technology, pp. 1-205.

Knipp et al., "Low Cost Approach to Realize Novel Detectors for Color Recognition", Forschungszentrum Jülich GmbH, Germany, pp. 350-353.

Kramer, Jörg, "Photo ASICs: Integrated Optical Metrology Systems with Industrial CMOS Technology", 1993, DISS. ETH Nr. 10186, pp. 1-91.

Miura et al., "A 100Frame/s CMOS Active Pixel Sensor for 30-Gesture Recognition System", 1999, IEEE International Solid-State Circuits Concerence, pp. 142-143.

Parulski et al., "Enabling Technologies for a Family of Digital Cameras", 1996, SPIE, vol. 2654, pp. 156-163.

Seitz et al., "Smart Optical and Image Sensors Fabricated with Industrial CMOS/CCD Semiconductor Processes", Jul. 1993, SPIE vol. 1900, pp. 21-30.

Sutherland, Don, "Neaveau Niche—Part I, The Latest in Digital SLRs", Nov. 1997, Shutterbug, 5 pp.

Wolffenbuttel et al., "Performance of an Integrated Silicon Colour Sensor with a Digital Output in Terms of Response to Colours in the Colour Triangle", 1990, Sensors and Actuators, Vo. A21-A23, pp. 574-580.

Wong, Hon-Sum, "Technology and Device Scaling Considerations for CMOS Imagers", Dec. 1996, IEEE Transactions on Elcetron Devices, vol. 43, No. 12, pp. 2131-2142.

* cited by examiner

VERTICAL COLOR FILTER DETECTOR GROUP WITH HIGHLIGHT DETECTOR

FIELD OF THE INVENTION

The present invention relates generally to image sensors. More specifically, the present invention relates to full-color detector groups and arrays of groups that use semiconductor material to chromatically filter light vertically and sense multiple wavelength bands at the same location at the same time.

BACKGROUND OF THE INVENTION

One of the uses of photography has always been to capture the actual scene before the photographer in an image that is at least as good as that seen by the human eye. In some senses, the image may even be better than that seen by the human eye. Historically, the images have been captured as analog data. More recently, the images have been captured as digital data. Since digital images are the relative newcomer to the scene, they are compared to analog images as the standard for image capture. One of the most common complaints about digital image quality is poor highlight rendition by comparison to analog images. Scenes with a broad range of brightness levels may create artifacts in the image where the brightness level is too high for the saturation exposure level. The nature of the artifact is a "flat" highlight area. Depending on the size and location of the artifact, it may be noticeable to the human viewer. One response of the photographer might be to reduce the exposure level, but this may result is loss of detail in the lowest brightness level areas, or "shadows" regions, of the scene. Such a result may be undesirable.

In principal, these artifacts can be at least reduced by increasing the dynamic range of the image sensor so that the exposure can be reduced without increasing noise in the sensor. However, this requires lowering the noise floor of the sensor which is difficult if not impossible. Another approach to reduce or eliminate the artifacts is to compress the high brightness areas of the image so that detail can be rendered in the highlights without affecting the exposure level of the rest of the image. The latter is accomplished by utilizing at least two different saturation exposure levels. The higher saturation exposure level is used to render the higher brightness areas of the image and the lower saturation exposure level is used to render the lower brightness areas of the image. Conventionally, when one utilizes a single sensor array this has been accomplished in one of two ways. The first way is through the use of a dual element sensor array with some elements of the sensors having a higher saturation exposure level and the rest of the elements having a lower saturation exposure level. The drawback to the dual element sensor array is that the overall resolution is reduced because there are fewer elements of either saturation exposure level. The second way is through the use of a sequential images with one image having a higher exposure level and the other image having a lower exposure level. The drawback to the sequential image approach is that there is a time gap between the images. If the scene is moving, then there might be a scene change between images resulting in an artifact in the area of the movement.

BRIEF DESCRIPTION OF THE INVENTION

A vertical color filter detector group with highlight detector for generating data for a picture element is disclosed. In one embodiment, the detector group includes three photodiodes each having its own spectral sensitivity and saturation exposure level and a highlight diode having a highlight saturation exposure level. The three photodiodes are located substantially each above or below the others in a semiconductor substrate with the highlight diode in close physical proximity thereto. The four diodes react to light exposure at about the same time as one another. The saturation exposure levels of the three photodiodes are about equal to each other and the highlight saturation exposure level is higher than each of the other three levels. The highlight diode may not be directly exposed to light, but it is close enough to the exposed photodiode region to collect some photoelectrons that are not collected by the three photodiodes.

BRIEF DESCRIPTION OF THE DRAWINGS

The accompanying drawings, which are incorporated into and constitute a part of this specification, illustrate one or more exemplary embodiments of the present invention and, together with the detailed description, serve to explain the principles and exemplary implementations of the invention.

In the drawings.

DETAILED DESCRIPTION OF THE INVENTION

Various exemplary embodiments of the present invention are described herein in the context of a digital camera using as an image sensor array of vertical color filter detector groups with highlight detectors. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to exemplary implementations of the present invention as illustrated in the accompanying drawings. The same reference indicators will be used throughout the drawings and the following detailed descriptions to refer to the same or like parts.

In the interest of clarity, not all of the routine features of the exemplary implementations described herein are shown and described. It will of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In the same field of endeavor and by the same inventor is a co-pending U.S. patent application Ser. No. 09/884,863 entitled Vertical Color Filter Detector Group and Array. The application discloses color detectors that use silicon as a color filter to give different spectral response characteristics to the detectors. A plurality of the detectors are taken as a group and are arranged vertically with respect to an illuminated surface of a silicon image sensor array. Herein the term "vertical color filter" refers to the color filtering properties of the silicon or other semiconductor material and the term "detector group" refers in part to a plurality of detectors with different color sensitivities at one pixel location in an image sensor array.

Figure 1:
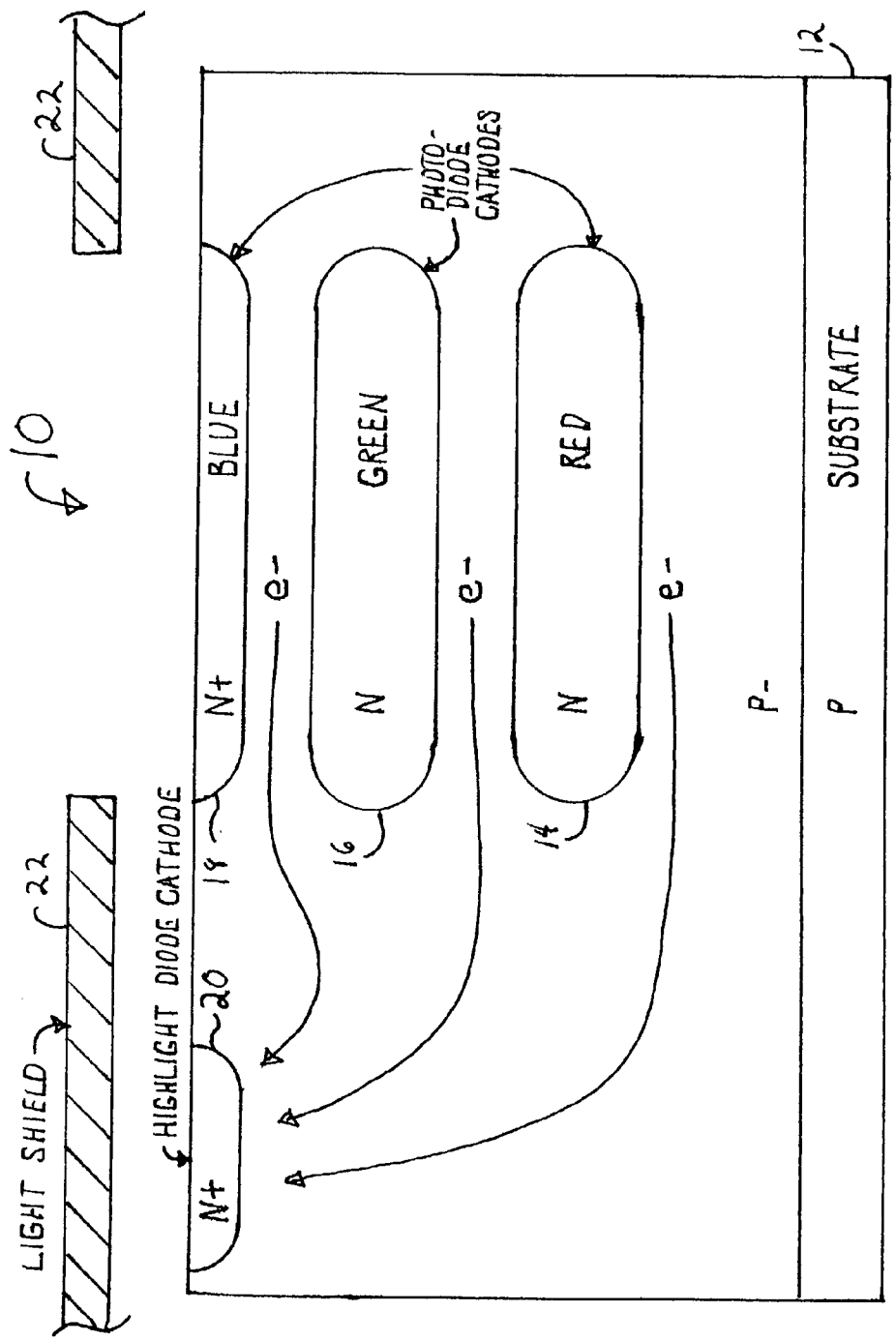
FIG. 1 is an illustrative and non-limiting example of four detector regions for a vertical color filter detector group according to the present invention.

Turning first to FIG. 1, an illustrative and non-limiting example of four detector regions for a vertical color filter detector group 10 according to the present invention is shown. Active-pixel-sensor circuitry that also forms part of the vertical color filter detector group 10 is not shown for clarity and will be discussed further below. The four detector regions of the vertical color filter detector group 10 are formed as a six-layer structure that is shown schematically in cross-sectional view fabricated on a p-type semiconductor substrate 12. There are three color detector regions, that is, red 14, green 16, and blue 18, and one highlight detector region 20. The three color detector regions 14, 16, and 18 are constructed as three n-type regions that are isolated vertically by p-type regions connected to the substrate potential. The three color detector regions 14, 16, and 18 form red, green, and blue photodiodes, respectively, at the junctions between the n-type and p-type regions. The photodiodes are disposed at different depths beneath the surface of the semiconductor structure to correspond to the optimal junction depths for absorption of the red, green, and blue wavelengths. Red, green, and blue photocharge signals are taken, respectively, from the n-type cathodes of the three isolated photodiodes. The highlight detector region 20 is also constructed as an n-type region and forms a highlight diode at the junction between the n-type and the p-type regions. A highlight signal is taken from the n-type cathode of the highlight diode. The highlight detector region 20 may be partially or fully protected by a light shield 22 while the three color detector regions 14, 16, and 18 are left exposed to rays of light from the scene being photographed. One of ordinary skill in the art will appreciate that the doping levels, the feature sizes, and the location of the highlight detector region 20 can vary from one application to another.

Figure 2:
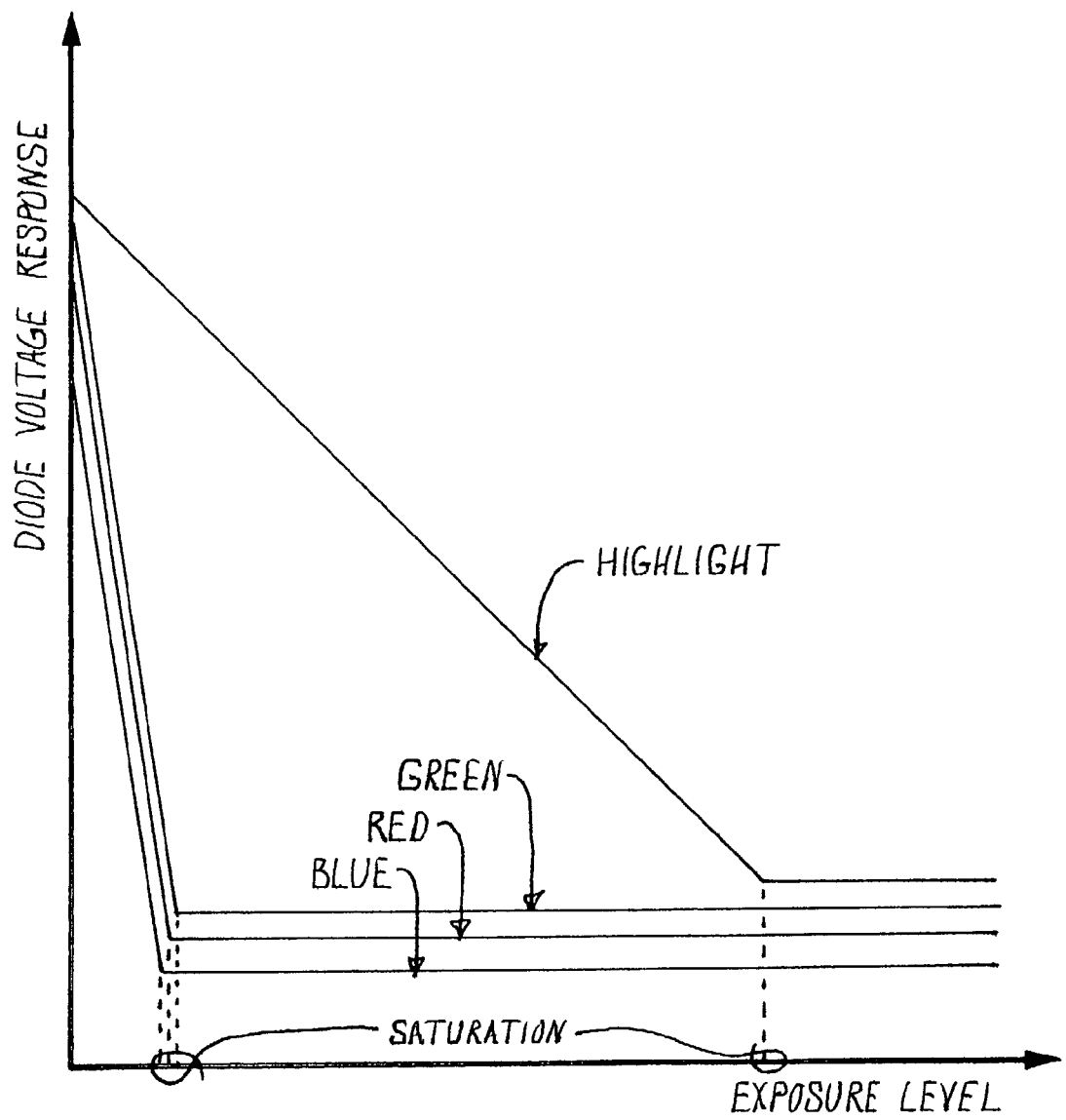
FIG. 2 is a graph of the relative responses of the four detector regions of the vertical color filter detector group of FIG. 1 to a varying light exposure level.

Turning now to FIG. 2, a graph of the relative responses of the four detector regions 14, 16, 18, and 20 of the vertical color filter detector group 10 of FIG. 1 to a varying light exposure level is shown. Where the four graphs intersect the Diode Voltage Response axis is the dark level which is set by the level of a reset reference voltage ($V_{REF}$). Each curve reaches a plateau level when the exposure level reaches what is referred to here as a saturation exposure level for that detector. Ideally, the three saturation exposure levels for the red, green, and blue detectors are approximately equal, while the highlight detector saturation exposure level is significantly higher, for example by a factor of two to ten. The difference in saturation exposure levels is shown much higher here for emphasis. It is by no means necessary to achieve the ideal to create an operative device. Depending on the circumstances, there may be considerable variation in the approximately equal saturation exposure levels of the three color detectors. Each saturation exposure level will of course depend on the spectral sensitivities of the detectors and the color of the light being used for the measurement. In the example given here, the light has been taken to be any typical white illuminant.

Returning to FIG. 1, the significance of the difference in the saturation exposure levels will be described. Assume that the vertical color filter detector group 10 has been exposed to light of sufficient brightness to cause the red, green, and blue detector regions 14, 16, and 18 to just reach but not exceed the threshold of their respective saturation exposure levels. This is the level at which the three color detector regions have reached their maximum photocharge capacity or signal output level (minimum voltage). As the brightness increases beyond the threshold, the three color detector regions become saturated and many of the excess electrons (e-) or minority carriers generated in the vicinity of each of the respective saturated color detector regions are conducted away by an overflow drain, or "anti-blooming", path through a reset transistor (not shown in FIG. 1). The voltage of the reset-low signal level controls the saturation exposure level in the voltage domain by controlling the potential barrier in the overflow drain path. Since the highlight detector region 20 has not yet reached its saturation exposure level, it has the capacity to collect some of the excess minority carriers as shown. Even before the color detector regions reach saturation, the highlight detector region collects some of the electrons generated in the vicinity of the color detector regions. As the color detector regions change their voltage by accumulating photocharge, their ability to collect electrons is somewhat reduced as their depletion regions shrink, so the proportion of electrons diffusing to the highlight detector region may increase nonlinearly. The four detector regions 14, 16, 18, and 20 react to exposure of the vertical color filter detector group 10 to light at about the same time as one another. The highlight detector region 20 enables the vertical color filter detector group 10 to capture detail in the brightest areas of the image with greater luminance information while still allowing full exposure in the other areas of the image for low-noise fully-saturated colors. The highlight signal is read out and stored in the same way as the three red, green, and blue photocharge signals. The four signals are processed to blend smoothly from the brighter areas to the less bright areas to reduce or eliminate artifacts in the image. The brighter highlights will have luminance variation, but no chroma information where the color detector regions are saturated.

Recall from above that active-pixel-sensor circuitry that also forms part of the vertical color filter detector group 10 is not shown in FIG. 1. Each of the four detector regions 14, 16, 18, and 20 will have corresponding active-pixel-sensor circuitry. Although it is not strictly required, it is presently preferred that the active-pixel-sensor circuitry for each of the four regions contain the same circuit elements. This promotes ease of design and manufacturing. This uniformity is even more useful for arrays of vertical color filter detector groups.

Figure 3:
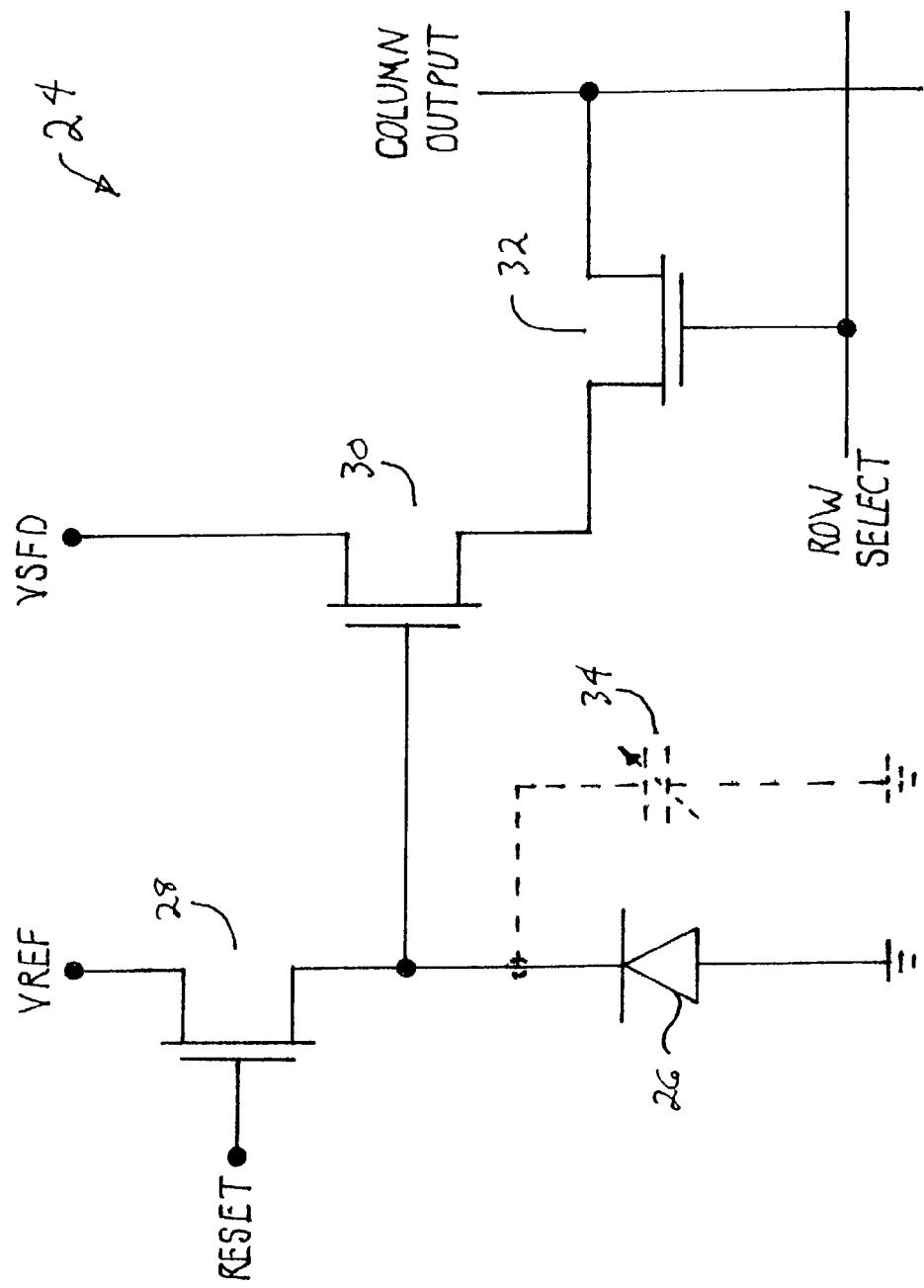
FIG. 3 is a schematic diagram of a non-storage version of an active-pixel-sensor circuit that forms part of the vertical color filter detector group of FIG. 1.

Turning now to FIG. 3, a schematic diagram of a non-storage version of an active-pixel-sensor circuit 24 that forms part of the vertical color filter detector group 10 of FIG. 1 is shown. Recall that each of the four detector regions 14, 16, 18, and 20 of FIG. 1 will have a corresponding active-pixel-sensor circuit 24. One of each of the four detector regions is represented schematically as the cathode of a diode 26. The three color detector regions 14, 16, and 18 form red-, green-, and blue-sensitive photodiodes, respectively, and the highlight detector region 20 forms a highlight diode. The anode of the diode 26 is connected to a substrate potential referred to herein as ground. The cathode of the diode 26 is connected to the source of a reset transistor 28. The gate of the reset transistor 28 is connected to a RESET node and the drain of the reset transistor 28 is connected to a reference voltage ($V_{REF}$) node. The cathode of the diode 26 and the source of the reset transistor 28 are connected to the gate of a source-follower transistor 30. The drain of the source-follower transistor 30 is connected to a source-follower drain voltage ($V_{SFD}$) node. The source of the source-follower transistor 30 is connected to the drain of a row select transistor 32. The gate of the row select transistor 32 is connected to a ROW SELECT node and the source of the row select transistor 32 is connected to a COLUMN OUTPUT node. The use of the terms row and column is for example purposes only and corresponds to an embodiment that arranges a plurality of vertical color filter detector groups 10 in a rectangular array. One of ordinary skill in the art will realize that other orderly arrangements are possible and that the terms row and column may be changed accordingly.

During operation, each of the various nodes is supplied with or is the source of at lest one corresponding signal. Within the active-pixel-sensor circuit 24, two or more of the nodes may be connected together. For example, the $V_{REF}$ node and the $V_{SFD}$ node or the $V_{REF}$ node and the COLUMN OUTPUT node may be connected together. In a one preferred embodiment, the $V_{REF}$ node for each active-pixel-sensor circuit 24 is common with the corresponding COLUMN OUTPUT node, to be used as a reset reference during reset, as an overflow drain path during exposure, and as an output path during readout, and thereby reducing the number of connections needed. Similarly, within the vertical color filter detector group 10, two or more of the active-pixel-sensor circuits 24 for the four detector regions 14, 16, 18, and 20 of FIG. 1 may have nodes that are connected together. For example, the four RESET nodes or the four ROW SELECT nodes may be connected together. Similar still, within an orderly arrangement of vertical color filter detector groups 10, one or more of the nodes from one group to another may be connected together. In the case of the rectangular array, one or more of the nodes are connected together by rows or columns and are commonly referred to as lines. For example, the RESET nodes from two or more groups in the array may be connected together. The actual connection scheme will vary from one application to another. Valid connection schemes are known in the art. Although not strictly required, it is presently preferred that the active-pixel-sensor circuits 24 for each of the highlight diode and the three color diodes be similarly connected. Likewise, valid signal values and timing diagrams are known in the art.

An optional nonlinear capacitor 34 is shown connected in parallel to the diode 26. The capacitor 34 may represent the inherent capacitance of the active-pixel-sensor circuit elements or it may be explicitly added as an element to further compress the response of the active-pixel-sensor circuit to photocharge. If the capacitance increases as the photocharge increases, the slope of the charge-to-voltage curve will decrease with exposure level, which is known as a compressive nonlinearity, and can help the dynamic range of the circuit. The nonlinear capacitor might for example be chosen as a MOS capacitor having the gate biased to a voltage such that the channel is in an "off" or low-capacity state at high signal voltage and an "on" or high-capacitance state for low signal voltage. The nonlinear capacitor 34 might preferably be added to only the highlight detector or to all of the four detectors.

Figure 4:
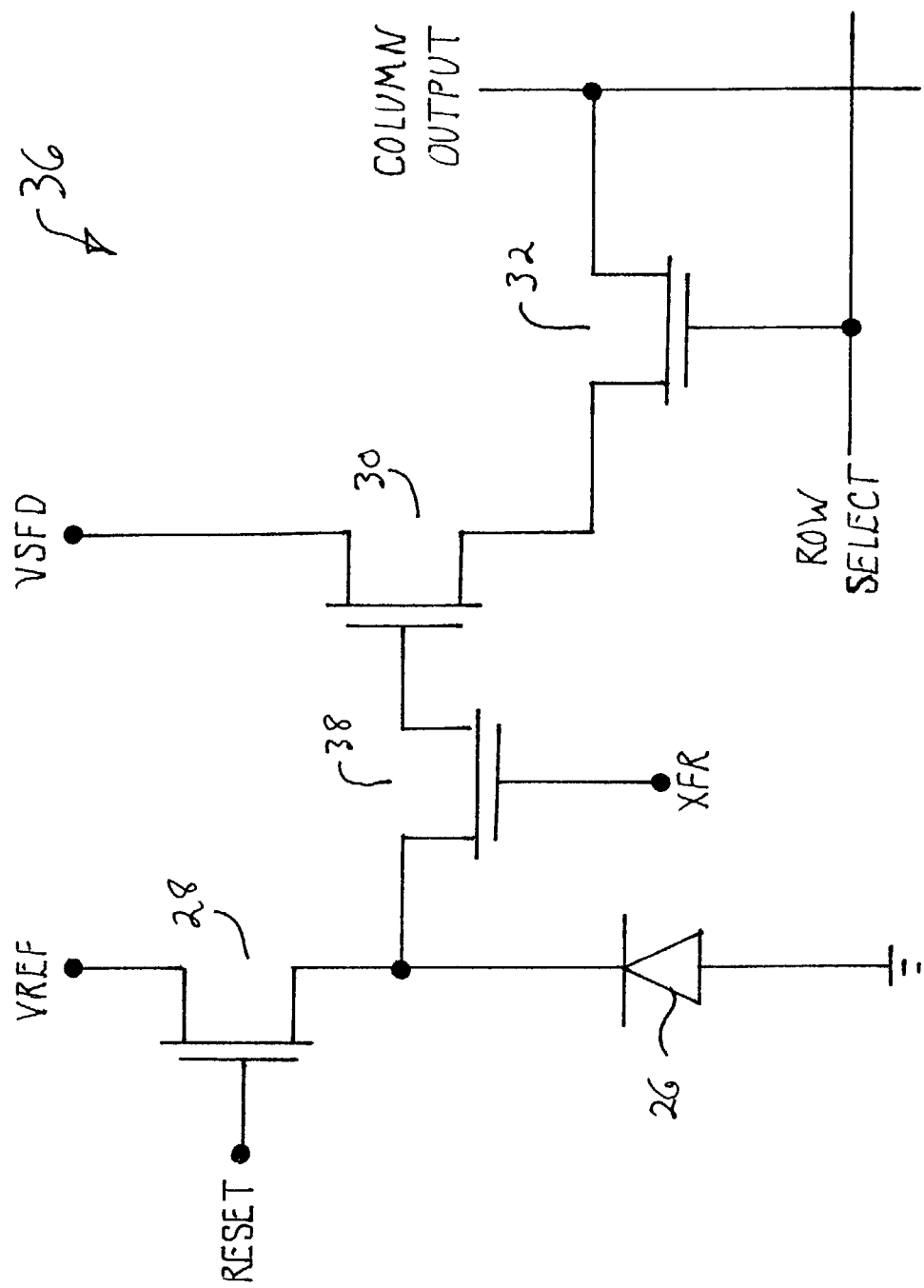
FIG. 4 is a schematic diagram of a storage version of an active-pixel-sensor circuit that forms part of the vertical color filter detector group of FIG. 1.

Turning now to FIG. 4, a schematic diagram of a storage version of an active-pixel-sensor circuit 36 that forms part of the vertical color filter detector group 10 of FIG. 1 is shown. The active-pixel-sensor circuit 36 is similar to the active-pixel-sensor circuit 24 except for the addition of a transfer transistor 38. The transfer transistor 38 has a source connected to the cathode of the diode 26 and the source of the reset transistor 28. The drain of the transfer transistor 38 is connected to the gate of the source-follower transistor 30. These designations of source and drain are chosen in accordance with the flow of photoelectrons. During a reset operation, electrons flow in the other direction, from drain to source. The gate of the transfer transistor 38 is connected to a transfer (XFR) node. As above, valid signals to and connections of the XFR node are known in the art. Although not shown, the optional nonlinear capacitor 34 of FIG. 3 is also optional here.

Figure 5:
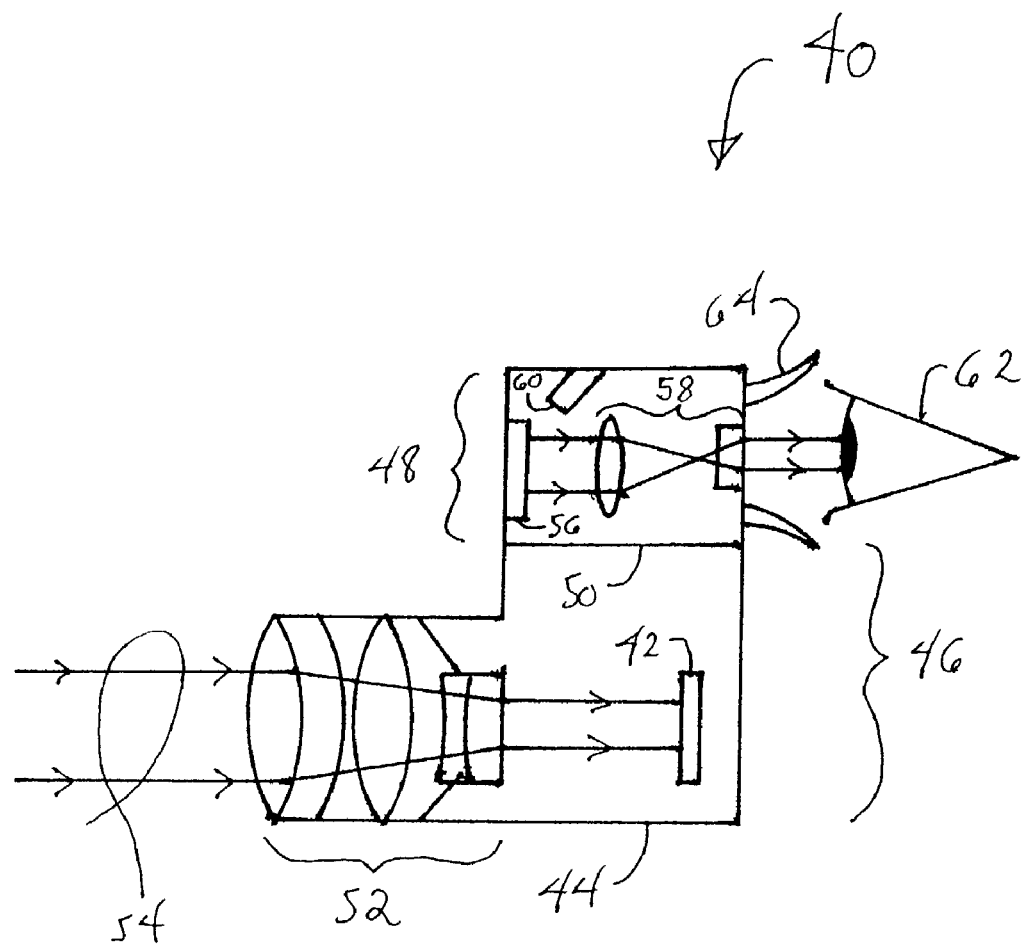
FIG. 5 is a cross sectional diagram of a digital still camera incorporating an array of vertical color filter detector groups of FIG. 1 as an image sensor chip.

Turning now to FIG. 5, a cross sectional diagram of a digital still camera 40 incorporating an array of vertical color filter detector groups 10 of FIG. 1 as an image sensor chip 42 is shown. The size and shape of the array will depend on a number of factors including price and application. The camera 40 includes a light-tight housing 44 that is divided into an imaging chamber 46 and a viewing chamber 48 by a light-tight baffle 50. The light-tight baffle 50 prevents light in one chamber from entering the other chamber. The imaging chamber 46 includes a primary optical system 52 and the image sensor chip 42. During operation, rays of light 54 from a scene to the left of the camera 40 are focused in a conventional manner by the primary optical system 52 onto the image sensor chip 42. The light-tight housing 44 prevents stray light from falling onto the image sensor chip 42 thereby corrupting the image formed by the focused rays of light 54. The viewing chamber 48 includes a display chip 56 and a secondary optical system 58. In one embodiment, the display chip 56 is illuminated by an LED array 60. In an alternative embodiment, the display chip 56 may be an organic light-emitting array, that is, it produces light directly and does not require the LED array 60 which is deleted. In either case, light from the display chip 56 is focused by the secondary optical system 58 in such a manner that images can be viewed by the photographer 62. An electronic system, not shown, takes electrical signals from the image sensor chip 42 and derives electrical signals that are suitable for driving the display chip 56. Both display chip technologies give bright displays with excellent color saturation, consume very little power, and are suitable for integration into a compact camera housing design. Viewing the image from the display chip 56 in bright ambient light may be made easier by providing an eye cup 64.

In the camera 40, data from the image sensor chip 42 takes the form of four signal channels, that is, red, green, blue, and highlight. The four signal channels are recorded and processed much as would be the data from a three signal channel sensor chip, but with an additional processing step to mix the four signals down to three conventional RGB color signals, utilizing the information from the highlight signal whenever one or more of the color photocharge signals is saturated. Numerous algorithms that are known in the art for mixing images taken at different exposure levels or different saturation levels should be adaptable to the purpose of combining the one highlight signal with the three color photocharge signals. Preferably, the present invention utilizes a single highlight value as a triple of equal RGB values representing a neutral highlight and applies any existing algorithm that can mix two RGB image values appropriately. Generally, all four signal channels are stored as raw data such that processing can be applied later with no loss of the original captured information.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A vertical color filter detector group comprising:
 a first photodiode having a first spectral sensitivity and a first saturation exposure level;
 a second photodiode having a second spectral sensitivity and a second saturation exposure level, the second photodiode being located substantially below the first photodiode in a semiconductor substrate; and
 a highlight diode having a highlight saturation exposure level,
 wherein the highlight diode is in close physical proximity to at least one of the first photodiode and the second photodiode; the first photodiode, the second photodiode, and the highlight diode react to exposure of the vertical color filter detector group to light at about the same time as one another; the first saturation exposure level and the second saturation exposure level are about equal to each other; and the highlight saturation exposure level is substantially higher than each of the first saturation exposure level and the second saturation exposure level.

2. The vertical color filter detector group as defined in claim 1, further comprising a light shield for at least partially blocking the highlight diode from incident light.

3. The vertical color filter detector group as defined in claim 1, wherein the highlight saturation exposure level is two to ten times higher than each of the first and second saturation exposure levels.

4. The vertical color filter detector group as defined in claim 1, further comprising highlight sensor circuitry coupled to the highlight diode.

5. The vertical color filter detector group as defined in claim 4, wherein the highlight sensor circuitry comprises:
 a reset transistor having a source connected to the highlight diode, a drain connected to a reference voltage node, and a gate connected to a reset node;
 a source-follower transistor having a gate connected to the source of the reset transistor, a drain connected to a drain voltage node, and a source; and
 a select transistor having a drain connected to the source of the source-follower transistor, a gate connected to a select node, and a source connected to an output node.

6. The vertical color filter detector group as defined in claim 5, wherein the highlight sensor circuitry further comprises:
 a nonlinear capacitor connected in parallel with the highlight diode.

7. The vertical color filter detector group as defined in claim 4, wherein the highlight sensor circuitry comprises:
 a reset transistor having a source connected to the highlight diode, a drain connected to a reference voltage node, and a gate connected to a reset node;
 a transfer transistor having a source connected to the source of the reset transistor, a gate connected to a transfer node, and a drain;
 a source-follower transistor having a gate connected to the drain of the transfer transistor, a drain connected to a drain voltage node, and a source; and
 a select transistor having a drain connected to the source of the source-follower transistor, a gate connected to a select node, and a source connected to an output node.

8. The vertical color filter detector group as defined in claim 7, wherein the highlight sensor circuitry further comprises:
 a nonlinear capacitor connected in parallel with the highlight diode.

9. The vertical color filter detector group as defined in claim 1, further comprising:
 a third photodiode having a third spectral sensitivity and a third saturation exposure level, wherein the third photodiode is located substantially below the first and second photodiodes in the semiconductor substrate and the third saturation exposure level is about equal to the first and second saturation exposure levels and is lower than the highlight saturation exposure level.

10. The vertical color filter detector group as defined in claim 9, wherein the first photodiode is a blue-sensitive photodiode, the second photodiode is a green-sensitive photodiode, and the third photodiode is a red-sensitive photodiode.

11. The vertical color filter detector group as defined in claim 10, further comprising sensor circuitry coupled to each of the red-sensitive, green-sensitive, blue-sensitive, and highlight diodes.

12. The vertical color filter detector group as defined in claim 11, wherein each of the sensor circuits comprises:
 a reset transistor having a source connected to one of the of the red-sensitive, green-sensitive, blue-sensitive, and highlight diodes, a drain connected to a reference voltage node, and a gate connected to a reset node;
 a source-follower transistor having a gate connected to the source of the reset transistor, a drain connected to a drain voltage node, and a source; and
 a select transistor having a drain connected to the source of the source-follower transistor, a gate connected to a select node, and a source connected to an output node.

13. The vertical color filter detector group as defined in claim 12, wherein the highlight sensor circuitry further comprises:
 a nonlinear capacitor connected in parallel with the highlight diode.

14. The vertical color filter detector group as defined in claim 11, wherein each of the sensor circuits comprises:
 a reset transistor having a source connected to one of the of the red-sensitive, green-sensitive, blue-sensitive, and highlight diodes, a drain connected to a reference voltage node, and a gate connected to a reset node;
 a transfer transistor having a source connected to the source of the reset transistor, a gate connected to a transfer node, and a drain;
 a source-follower transistor having a gate connected to the drain of the transfer transistor, a drain connected to a drain voltage node, and a source; and
 a select transistor having a drain connected to the source of the source-follower transistor, a gate connected to a select node, and a source connected to an output node.

15. The vertical color filter detector group as defined in claim 14, wherein the highlight sensor circuitry further comprises:
 a nonlinear capacitor connected in parallel with the highlight diode.

16. An orderly arrangement of a plurality of vertical color filter detector groups, each of the plurality of vertical color filter detector groups comprising:

a first photodiode having a first spectral sensitivity and a first saturation exposure level;

a second photodiode having a second spectral sensitivity and a second saturation exposure level, the second photodiode being located substantially below the first photodiode in a semiconductor substrate; and a highlight diode having a highlight saturation exposure level, wherein the highlight diode is in close physical proximity to at least one of the first photodiode and the second photodiode; the first photodiode, the second photodiode, and the highlight diode react to exposure of the vertical color filter detector group to light at about the same time as one another; the first saturation exposure level and the second saturation exposure level are about equal to each other; and the highlight saturation exposure level is substantially higher than each of the first saturation exposure level and the second saturation exposure level.

17. The orderly arrangement as defined in claim 16, further comprising a light shield for at least partially blocking the highlight diode of each of the plurality of vertical color filter detector groups from incident light.

18. The orderly arrangement as defined in claim 16, wherein for each of the plurality of vertical color filter detector groups the highlight saturation exposure level is two to ten times higher than each of the first and second saturation exposure levels.

19. The orderly arrangement as defined in claim 16, wherein each of the plurality of vertical color filter detector groups further comprises highlight sensor circuitry coupled to the highlight diode.

20. The orderly arrangement as defined in claim 19, wherein the highlight sensor circuitry for each of the plurality of vertical color filter detector groups comprises:

a reset transistor having a source connected to the highlight diode, a drain connected to a reference voltage node, and a gate connected to a reset node;

a source-follower transistor having a gate connected to the source of the reset transistor, a drain connected to a drain voltage node, and a source; and a select transistor having a drain connected to the source of the source-follower transistor, a gate connected to a select node, and a source connected to an output node.

21. The orderly arrangement as defined in claim 20, wherein the highlight sensor circuitry for each of the plurality of vertical color filter detector groups further comprises:

a nonlinear capacitor connected in parallel with the highlight diode.

22. The orderly arrangement as defined in claim 19, wherein the highlight sensor circuitry for each of the plurality of vertical color filter detector groups comprises:

a reset transistor having a source connected to the highlight diode, a drain connected to a reference voltage node, and a gate connected to a reset node;

a transfer transistor having a source connected to the source of the reset transistor, a gate connected to a transfer node, and a drain;

a source-follower transistor having a gate connected to the drain of the transfer transistor, a drain connected to a drain voltage node, and a source; and a select transistor having a drain connected to the source of the source-follower transistor, a gate connected to a select node, and a source connected to an output node.

23. The orderly arrangement as defined in claim 22, wherein the highlight sensor circuitry for each of the plurality of vertical color filter detector groups further comprises:

a nonlinear capacitor connected in parallel with the highlight diode.

24. The orderly arrangement as defined in claim 16, wherein each of the plurality of vertical color filter detector groups further comprises:

a third photodiode having a third spectral sensitivity and a third saturation exposure level, wherein the third photodiode is located substantially below the first and second photodiodes in the semiconductor substrate and the third saturation exposure level is about equal to the first and second saturation exposure levels and is lower than the highlight saturation exposure level.

25. The orderly arrangement as defined in claim 24, wherein for each of the plurality of vertical color filter detector groups the first photodiode is a blue-sensitive photodiode, the second photodiode is a green-sensitive photodiode, and the third photodiode is a red-sensitive photodiode.

26. The orderly arrangement as defined in claim 25, wherein each of the plurality of vertical color filter detector groups further comprises sensor circuitry coupled to each of the red-sensitive, green-sensitive, blue-sensitive, and highlight diodes.

27. The orderly arrangement as defined in claim 26, wherein each of the sensor circuits for each of the plurality of vertical color filter detector groups comprises:

a reset transistor having a source connected to one of the of the red-sensitive, green-sensitive, blue-sensitive, and highlight diodes, a drain connected to a reference voltage node, and a gate connected to a reset node;

a source-follower transistor having a gate connected to the source of the reset transistor, a drain connected to a drain voltage node, and a source; and a select transistor having a drain connected to the source of the source-follower transistor, a gate connected to a select node, and a source connected to an output node.

28. The orderly arrangement as defined in claim 27, wherein the highlight sensor circuitry for each of the plurality of vertical color filter detector groups further comprises:

a nonlinear capacitor connected in parallel with the highlight diode.

29. The orderly arrangement as defined in claim 26, wherein each of the sensor circuits for each of the plurality of vertical color filter detector groups comprises:

a reset transistor having a source connected to one of the of the red-sensitive, green-sensitive, blue-sensitive, and highlight diodes, a drain connected to a reference voltage node, and a gate connected to a reset node;

a transfer transistor having a source connected to the source of the reset transistor, a gate connected to a transfer node, and a drain;

a source-follower transistor having a gate connected to the drain of the transfer transistor, a drain connected to a drain voltage node, and a source; and a select transistor having a drain connected to the source of the source-follower transistor, a gate connected to a select node, and a source connected to an output node.

30. The orderly arrangement as defined in claim 29, wherein the highlight sensor circuitry for each of the plurality of vertical color filter detector groups further comprises:

a nonlinear capacitor connected in parallel with the highlight diode.

31. An array of a plurality of vertical color filter detector groups integrated on a semiconductor substrate and arranged in a plurality of rows and a plurality of columns, each of the plurality of vertical color filter detector groups comprising:
  a first photodiode having a first spectral sensitivity and a first saturation exposure level;
  a second photodiode having a second spectral sensitivity and a second saturation exposure level, the second photodiode being located substantially below the first photodiode in a semiconductor substrate;
  a third photodiode having a third spectral sensitivity and a third saturation exposure level, wherein the third photodiode is located substantially below the first and second photodiodes in the semiconductor substrate; and
  a highlight diode having a highlight saturation exposure level,
  wherein the highlight diode is in close physical proximity to at least one of the first photodiode, the second photodiode, and the third photodiode; the first photodiode, the second photodiode, the third photodiode, and the highlight diode react to exposure of the vertical color filter detector group to light at about the same time as one another; the first saturation exposure level, the second saturation exposure level, and the third saturation exposure level are about equal to each other; and the highlight saturation exposure level is substantially higher than each of the first saturation exposure level, the second saturation exposure level, and the third saturation exposure level.

32. The array as defined in claim 31, wherein for each of the plurality of vertical color filter detector groups the highlight saturation exposure level is two to ten times higher than each of the first, second, and third saturation exposure levels.

33. The array as defined in claim 31, wherein for each of the plurality of vertical color filter detector groups the first photodiode is a blue-sensitive photodiode, the second photodiode is a green-sensitive photodiode, and the third photodiode is a red-sensitive photodiode.

34. The array as defined in claim 33, wherein each of the plurality of vertical color filter detector groups further comprises sensor circuitry coupled to each of the red-sensitive, green-sensitive, blue-sensitive, and highlight diodes.

35. The array as defined in claim 34, further comprising for each of the plurality of vertical color filter detector groups a light shield for at least partially blocking the highlight diode and the sensor circuitry from incident light.

36. The array as defined in claim 34, wherein each of the sensor circuits for each of the plurality of vertical color filter detector groups comprises:
  a reset transistor having a source connected to one of the of the red-sensitive, green-sensitive, blue-sensitive, and highlight diodes, a drain connected to a reference voltage node, and a gate connected to a reset node;
  a source-follower transistor having a gate connected to the source of the reset transistor, a drain connected to a drain voltage node, and a source; and
  a row select transistor having a drain connected to the source of the source-follower transistor, a gate connected to a row select line, and a source connected to a column output line.

37. The array as defined in claim 36, wherein the highlight sensor circuitry for each of the plurality of vertical color filter detector groups further comprises:
  a nonlinear capacitor connected in parallel with the highlight diode.

38. The array as defined in claim 34, wherein each of the sensor circuits for each of the plurality of vertical color filter detector groups comprises:
  a reset transistor having a source connected to one of the of the red-sensitive, green-sensitive, blue-sensitive, and highlight diodes, a drain connected to a reference voltage node, and a gate connected to a reset node;
  a transfer transistor having a source connected to the source of the reset transistor, a gate connected to a transfer node, and a drain;
  a source-follower transistor having a gate connected to the drain of the transfer transistor, a drain connected to a drain voltage node, and a source; and
  a row select transistor having a drain connected to the source of the source-follower transistor, a gate connected to a row select line, and a source connected to a column output line.

39. The array as defined in claim 38, wherein the highlight sensor circuitry for each of the plurality of vertical color filter detector groups further comprises:
  a nonlinear capacitor connected in parallel with the highlight diode.

40. A digital camera comprising:
  a light-tight housing; and
  an image sensor contained at least partially within the light-tight housing,
  wherein the image sensor comprises an array of a plurality of vertical color filter detector groups and wherein each of the plurality of vertical color filter detector groups comprises:
    a first photodiode having a first spectral sensitivity and a first saturation exposure level;
    a second photodiode having a second spectral sensitivity and a second saturation exposure level, the second photodiode being located substantially below the first photodiode in a semiconductor substrate; and
    a highlight diode having a highlight saturation exposure level,
    wherein the highlight diode is in close physical proximity to at least one of the first photodiode and the second photodiode; the first photodiode, the second photodiode, and the highlight diode react to exposure of the vertical color filter detector group to light at about the same time as one another; the first saturation exposure level and the second saturation exposure level are about equal to each other; and the highlight saturation exposure level is substantially higher than each of the first saturation exposure level and the second saturation exposure level.

41. The digital camera as defined in claim 40, wherein for each of the plurality of vertical color filter detector groups the highlight saturation exposure level is two to ten times higher than each of the first and second saturation exposure levels.

42. The digital camera as defined in claim 40, wherein each of the plurality of vertical color filter detector groups further comprises highlight sensor circuitry coupled to the highlight diode.

43. The digital camera as defined in claim 42, wherein the image sensor further comprises for each of the plurality of vertical color filter detector groups a light shield for at least partially blocking the highlight diode and the highlight sensor circuitry from incident light.

44. The digital camera as defined in claim 42, wherein the highlight sensor circuitry for each of the plurality of vertical color filter detector groups comprises:
   a reset transistor having a source connected to the highlight diode, a drain connected to a reference voltage node, and a gate connected to a reset node;
   a source-follower transistor having a gate connected to the source of the reset transistor, a drain connected to a drain voltage node, and a source; and
   a select transistor having a drain connected to the source of the source-follower transistor, a gate connected to a select node, and a source connected to an output node.

45. The digital camera as defined in claim 44, wherein the highlight sensor circuitry for each of the plurality of vertical color filter detector groups further comprises:
   a nonlinear capacitor connected in parallel with the highlight diode.

46. The digital camera as defined in claim 42, wherein the highlight sensor circuitry for each of the plurality of vertical color filter detector groups comprises:
   a reset transistor having a source connected to the highlight diode, a drain connected to a reference voltage node, and a gate connected to a reset node;
   a transfer transistor having a source connected to the source of the reset transistor, a gate connected to a transfer node, and a drain;
   a source-follower transistor having a gate connected to the drain of the transfer transistor, a drain connected to a drain voltage node, and a source; and
   a select transistor having a drain connected to the source of the source-follower transistor, a gate connected to a select node, and a source connected to an output node.

47. The digital camera as defined in claim 46, wherein the highlight sensor circuitry for each of the plurality of vertical color filter detector groups further comprises:
   a nonlinear capacitor connected in parallel with the highlight diode.

48. The digital camera as defined in claim 40, wherein each of the plurality of vertical color filter detector groups further comprises:
   a third photodiode having a third spectral sensitivity and a third saturation exposure level, wherein the third photodiode is located substantially below the first and second photodiodes in the semiconductor substrate and the third saturation exposure level is about equal to the first and second saturation exposure levels and is, lower than the highlight saturation exposure level.

49. The digital camera as defined in claim 48, wherein for each of the plurality of vertical color filter detector groups the first photodiode is a blue-sensitive photodiode, the second photodiode is a green-sensitive photodiode, and the third photodiode is a red-sensitive photodiode.

50. The digital camera as defined in claim 49, wherein each of the plurality of vertical color filter detector groups further comprises sensor circuitry coupled to each of the red-sensitive, green-sensitive, blue-sensitive, and highlight diodes.

51. The digital camera as defined in claim 50, wherein the image sensor further comprises for each of the plurality of vertical color filter detector groups a light shield for at least partially blocking each of the red-sensitive, green-sensitive, blue-sensitive, and highlight diodes and the sensor circuitry from incident light.

52. The digital camera as defined in claim 50, wherein each of the sensor circuits for each of the plurality of vertical color filter detector groups comprises:
   a reset transistor having a source connected to one of the of the red-sensitive, green-sensitive, blue-sensitive, and highlight diodes, a drain connected to a reference voltage node, and a gate connected to a reset node;
   a source-follower transistor having a gate connected to the source of the reset transistor, a drain connected to a drain voltage node, and a source; and
   a select transistor having a drain connected to the source of the source-follower transistor, a gate connected to a select node, and a source connected to an output node.

53. The digital camera as defined in claim 52, wherein the highlight sensor circuitry for each of the plurality of vertical color filter detector groups further comprises:
   a nonlinear capacitor connected in parallel with the highlight diode.

54. The digital camera as defined in claim 50, wherein each of the sensor circuits for each of the plurality of vertical color filter detector groups comprises:
   a reset transistor having a source connected to one of the of the red-sensitive, green-sensitive, blue-sensitive, and highlight diodes, a drain connected to a reference voltage node, and a gate connected to a reset node;
   a transfer transistor having a source connected to the source of the reset transistor, a gate connected to a transfer node, and a drain;
   a source-follower transistor having a gate connected to the drain of the transfer transistor, a drain connected to a drain voltage node, and a source; and
   a select transistor having a drain connected to the source of the source-follower transistor, a gate connected to a select node, and a source connected to an output node.

55. The digital camera as defined in claim 54, wherein the highlight sensor circuitry for each of the plurality of vertical color filter detector groups further comprises:
   a nonlinear capacitor connected in parallel with the highlight diode.

56. A method of generating data for a picture element utilizing a vertical color filter detector group having a highlight diode and a first photodiode located substantially above a second photodiode in a semiconductor substrate, the method comprising:
   collecting photoelectrons using the first photodiode, the first photodiode having a first spectral sensitivity and a first saturation exposure level;
   collecting photoelectrons using the second photodiode, the second photodiode having a second spectral sensitivity and a second saturation exposure level; and
   collecting photoelectrons using the highlight diode, the highlight diode having a substantially higher saturation exposure level than either the first saturation exposure level or the second saturation exposure level,
   wherein the collecting of photoelectrons is performed at about the same time from about the same physical location.

57. The method as defined in claim 56, wherein the vertical color filter detector group further has a third photodiode located substantially below the first and second photodiodes in the semiconductor substrate and wherein the method further comprises:
   collecting photoelectrons using the third photodiode, the third photodiode having a third spectral sensitivity and a third saturation exposure level, wherein the saturation exposure level of the highlight diode is substantially higher than the third saturation exposure level.

58. An apparatus for generating data for a picture element comprising:
   first means for collecting photoelectrons, the first means having a first spectral sensitivity and a first saturation exposure level;
   second means for collecting photoelectrons, the second means having a second spectral sensitivity and a second saturation exposure level and the second means being located substantially below the first means in a semiconductor substrate; and
   low-sensitivity means for collecting photoelectrons, the low-sensitivity means having a substantially higher saturation exposure level than either the first saturation exposure level or the second saturation exposure level,
   wherein the collecting of photoelectrons is performed at about the same time from about the same physical location.

59. The apparatus as defined in claim 58, wherein the apparatus further comprises:
   third means for collecting photoelectrons, the third means having a third spectral sensitivity and a third saturation exposure level and being located substantially below the first and second means for collecting photoelectrons in the semiconductor substrate,
   wherein the saturation exposure level of the low-sensitivity means is substantially higher than the third saturation exposure level.

* * * * *